(12) United States Patent  
Stave

(10) Patent No.: US 7,167,401 B2  
(45) Date of Patent: Jan. 23, 2007

(54) LOW POWER CHIP SELECT (CS) LATENCY OPTION

(75) Inventor: Eric Stave, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 11/055,332

(22) Filed: Feb. 10, 2005

(65) Prior Publication Data

US 2006/0176744 A1 Aug. 10, 2006

(51) Int. Cl.  
*G11C 7/00* (2006.01)

(52) U.S. Cl. ................. 365/194; 365/189.05; 365/191; 365/233

(58) Field of Classification Search ................. 365/194  
See application file for complete search history.

(56) References Cited

U.S. PATENT DOCUMENTS

| | | | | | |
|---|---|---|---|---|---|
| 5,602,798 | A | * | 2/1997 | Sato et al. | 365/233 |
| 5,926,435 | A | * | 7/1999 | Park et al. | 365/233 |
| 5,959,930 | A | * | 9/1999 | Sakurai | 365/230.03 |
| 5,986,943 | A | * | 11/1999 | Isa | 365/189.04 |
| 6,188,641 | B1 | * | 2/2001 | Uchida | 365/233 |
| 6,256,260 | B1 | * | 7/2001 | Shim et al. | 365/233 |
| 6,351,433 | B1 | * | 2/2002 | Kosugi | 365/233 |
| 6,356,489 | B1 | * | 3/2002 | Lee | 365/198 |
| 6,594,770 | B1 | * | 7/2003 | Sato et al. | 713/320 |
| 2005/0157585 | A1 | * | 7/2005 | Kato et al. | 365/233 |

OTHER PUBLICATIONS

H. Heske, article entitled: Mobile RAMs can help save power, Portable Design, Jul. 2002, pp. 1-4, appearing at http://cgw.archives.printthis.clickability.com.

MICRON, Designline, vol. 12, Issue 2, containing article entitled: DDR2 Offers New Features and Functionability, pp. 1-16, available at website http://www.alienware.com/.

product_detail_pages/Area-51/PDFs on Dec. 23, 2004.

MICRON Double Data Rate (DDR) SDRAM specification, pp. 1-84 available at website http://download.micron.com/pdf/datasheets/dram/ddr/.

256MBDDRx4x8x16.pdf on Dec. 27, 2004.

* cited by examiner

*Primary Examiner*—Son L. Mai  
(74) *Attorney, Agent, or Firm*—Jones Day; Edward L. Pencoske

(57) ABSTRACT

A system and method to reduce standby currents in input buffers in an electronic device (e.g., a memory device) is disclosed. The input buffers may be activated or deactivated by the state of a chip select (CS) signal. In case of a memory device, the active and precharge standby currents in memory input buffers may be reduced by turning off the input buffers when the CS signal is in an inactive state. A memory controller may supply the CS signal to the memory device at least one clock cycle earlier than other control signals including the RAS (row address strobe) signal, the CAS (column address strobe) signal, the WE (write enable) signal, etc. A modified I/O circuit in the memory device may internally delay the CS signal by at least one clock cycle to coincide its timing with the RAS/CAS signals for normal data access operation whereas the turning on/off of the memory input buffers may be performed by the CS signal received from the memory controller on the previous cycle. Thus, activation and deactivation of memory input buffers may be performed without forcing the memory device into power down mode and without employing complex circuits for power management. Because of the rules governing abstracts, this abstract should not be used to construe the claims.

15 Claims, 5 Drawing Sheets

FIG. 2A  CLK

FIG. 2B  CS

FIG. 2C  CAS

FIG. 2D  RAS
(PRIOR ART)

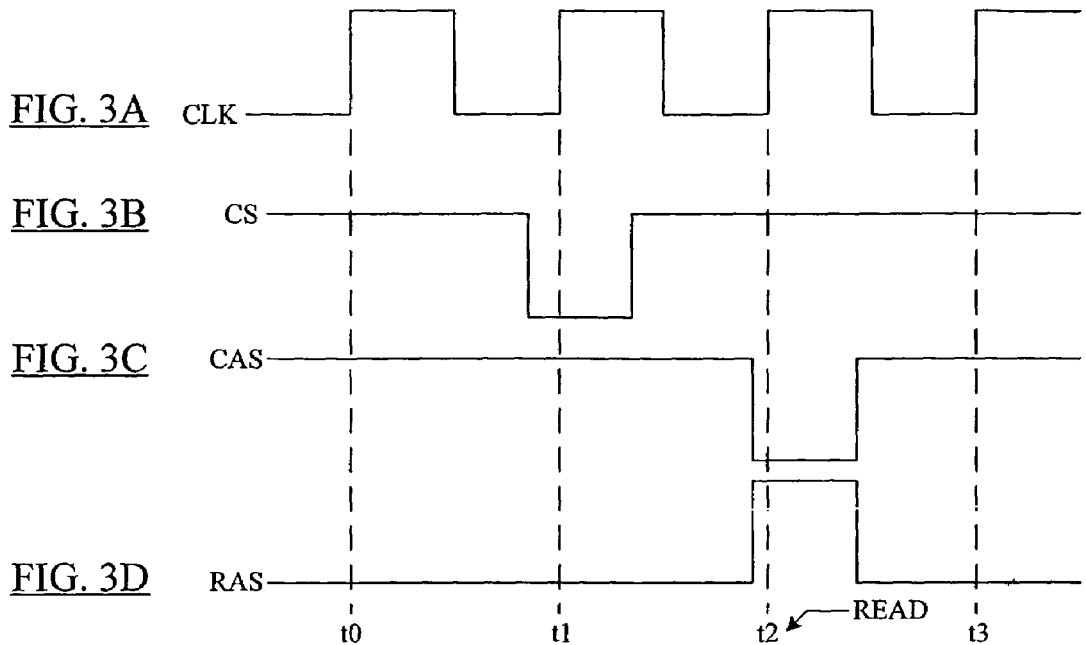
FIG. 3A CLK
FIG. 3B CS
FIG. 3C CAS
FIG. 3D RAS
FIG. 4
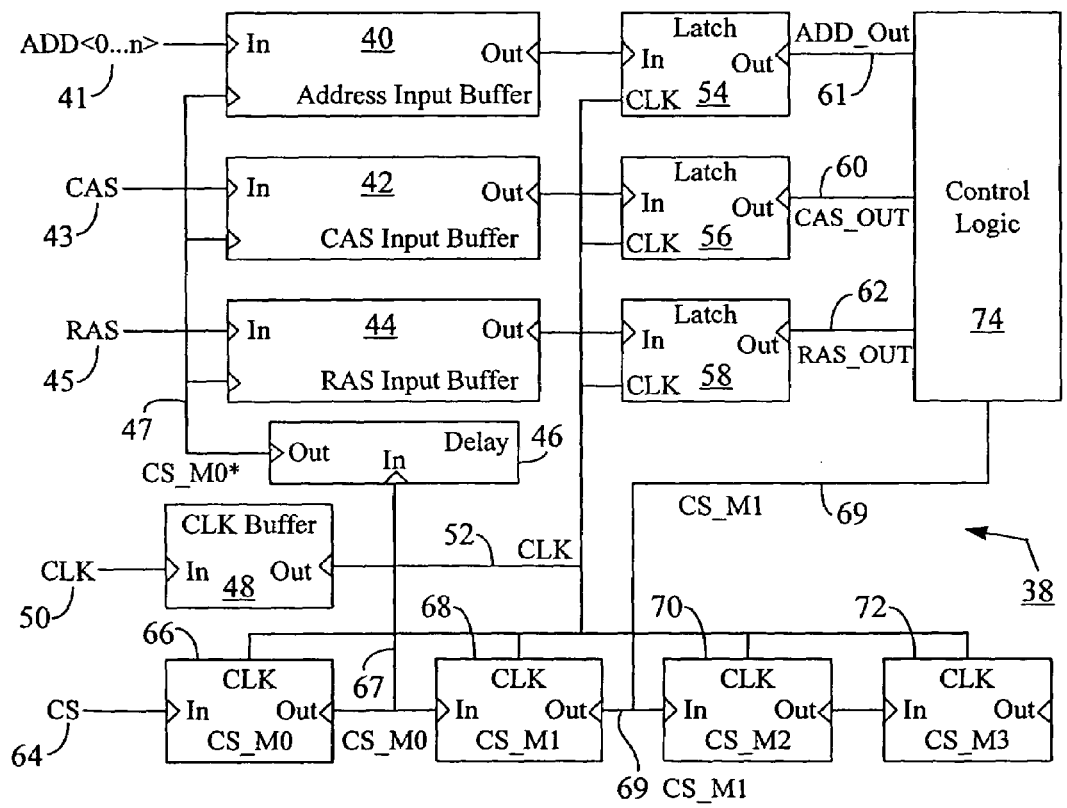

LOW POWER CHIP SELECT (CS) LATENCY OPTION

BACKGROUND

1. Field of the Disclosure

The present disclosure generally relates to electronic devices and, more particularly, to a system and method to reduce current consumption in semiconductor memory chips.

2. Brief Description of Related Art

Memory devices are electronic devices that are widely used in many electronic products and computers to store data. A memory device is a semiconductor electronic device that includes a number of memory cells, each cell storing one bit of data. The data stored in the memory cells can be read during a read operation. FIG. 1 is a simplified block diagram showing a memory chip or memory device 12. The memory chip 12 may be part of a DIMM (dual in-line memory module) or a PCB (printed circuit board) containing many such memory chips (not shown in FIG. 1). The memory chip 12 may include a plurality of pins or ball contacts 24 located outside of chip 12 for electrically connecting the chip 12 to other system devices. Some of those pins 24 may constitute memory address pins or address bus 17, data (DQ) pins or data bus 18, and control pins or control bus 19. It is evident that each of the reference numerals 17–19 designates more than one pin in the corresponding bus. Further, it is understood that the schematic in FIG. 1 is for illustration only. That is, the pin arrangement or configuration in a typical memory chip may not be in the form shown in FIG. 1.

A processor or memory controller (not shown) may communicate with the chip 12 and perform memory read/write operations. The processor and the memory chip 12 may communicate using address signals on the address lines or address bus 17, data signals on the data lines or data bus 18, and control signals (e.g., a row address select (RAS) signal, a column address select (CAS) signal, a chip select (CS) signal, etc. (not shown)) on the control lines or control bus 19. The "width" (i.e., number of pins) of address, data and control buses may differ from one memory configuration to another.

Those of ordinary skill in the art will readily recognize that memory chip 12 of FIG. 1 is simplified to illustrate one embodiment of a memory chip and is not intended to be a detailed illustration of all of the features of a typical memory chip. Numerous peripheral devices or circuits may be typically provided along with the memory chip 12 for writing data to and reading data from the memory cells 26. However, these peripheral devices or circuits are not shown in FIG. 1 for the sake of clarity.

The memory chip 12 may include a plurality of memory cells 26 generally arranged in an array of rows and columns. A row decode circuit 28 and a column decode circuit 30 may select the rows and columns, respectively, in the array in response to decoding an address provided on the address bus 17. Data to/from the memory cells 26 are then transferred over the data bus 18 via sense amplifiers and a data output path (not shown). A memory controller (not shown) may provide relevant control signals (not shown) on the control bus 19 to control data communication to and from the memory chip 12 via an I/O (input/output) circuit 32. The I/O circuit 32 may include a number of data output buffers or output drivers to receive the data bits from the memory cells 26 and provide those data bits or data signals to the corresponding data lines in the data bus 18. The I/O circuit 32 may also include various memory input buffers and control circuits that interact with the row and column decoders 28, 30, respectively, to select the memory cells for data read/write operations.

The memory controller (not shown) may determine the modes of operation of memory chip 12. Some examples of the input signals or control signals (not shown in FIG. 1) on the control bus 19 include an External Clock (CLK) signal, a Chip Select (CS) signal, a Row Address Strobe (RAS) signal, a Column Address Strobe (CAS) signal, a Write Enable (WE) signal, etc. The memory chip 12 communicates to other devices connected thereto via the pins 24 on the chip 12. These pins, as mentioned before, may be connected to appropriate address, data and control lines to carry out data transfer (i.e., data transmission and reception) operations.

FIGS. 2A–2D (collectively referred to hereinafter as "FIG. 2") depict simplified diagrams illustrating an exemplary prior art timing relationship among the CS, CAS, and RAS signals during a memory read operation. The timing relationship in FIG. 2 is shown with reference to an external clock signal (CLK), which may be supplied to various logic circuits in the memory chip 12 via corresponding clock buffers. However, for the sake of simplicity, the outputs of such clock buffers are also referred to herein as the CLK signals. In the embodiment of FIG. 2, a memory read operation is initiated at time t=t1, i.e., at the rising edge of the second clock pulse in the CLK signal. At the time of memory read operation, the chip select (CS) signal is applied to select one of the memory banks (not shown) in the memory chip 12 from which data is to be read. In the event that there is only one memory bank in the chip 12, the chip select signal may select the memory chip 12 itself. In any event, the CS signal may enable and disable the logic (not shown) in the memory chip 12 that decodes a command (e.g., a READ command, or a WRITE command, etc.) received, for example, from the external memory controller (not shown). As is known in the art, the CAS and RAS signals are also applied relatively simultaneously with the CS signal and in proper combination (e.g., the CAS signal being "low" whereas the RAS signal being "high" for a data read operation) to activate the appropriate row and column(s) in the selected memory bank to read the data bits at the memory address received via the address bus 17. For the sake of simplicity, FIG. 2 does not illustrate an exhaustive set of waveforms present during a memory read/write operation. For example, additional control signals (e.g., a write enable (WE) signal) that are typically operative during a memory read/write operation are not illustrated in FIG. 2 for ease of illustration as may be evident to one skilled in the art.

It is also known in the art that, depending on the design of the memory chip 12, one of the RAS or CAS signals may be used to trigger row activation and precharge operations. For example, in the waveform configuration of FIG. 2, a memory row may remain precharged so long as the RAS signal is "low", whereas the memory row may be activated for data access once the RAS signal has gone "high" (for example, during a memory read operation as illustrated in FIG. 2). In another configuration, the CAS signal states may be used for similar purpose. Various memory input buffers (not shown) provide the RAS and CAS signals to a control circuit (not shown) to accomplish the row activation and precharge operations. As noted here, all states of the RAS signal ("low" or "high") (or the CAS signal, as the case may be) are used to accomplish row activation and precharge. Thus, the input buffers (not shown) for the RAS and CAS signals always remains ON to convey the RAS/CAS signal states to the control circuit. The memory address input buffer (not shown) also similarly remains ON to provide the address of the memory location to be accessed during a data read/write operation. In that event, a significant current is consumed by these always ON input buffers. This current consumption may be unnecessary especially when the memory row is in a standby mode after being activated or precharged, i.e., during the time when no data read/write operations are actually taking place.

In one prior art method, the active and precharge standby currents consumed by various memory input buffers may be reduced by deactivating the clock enable (CKE) signal (not shown) supplied to the memory chip 12. In a DDR (Double Data Rate) SDRAM (Synchronous Dynamic Random Access Memory), the CKE signal is generally active at all times that a memory access is in progress, from the issuing of a READ or WRITE command until completion of the data access. However, the DDR SDRAM memory chip (e.g., the memory chip 12) may support a power-down mode in which the CKE signal is de-asserted or deactivated to force various memory circuits, including the memory input buffers (not shown), to enter into an idle state with significantly reduced current consumption. It is observed, however, that the entry into and exit from the power-down mode may require deactivation of the CKE signal for at least three clock cycles or more depending on the design of the memory chip. Furthermore, a valid executable command may not be applied one or more clock cycles after the power-down mode is exited. Such lengthy clock delays may not be desirable in all applications or at all times.

It is therefore desirable to devise a scheme whereby power saving is achieved without forcing the memory chip or a similar electronic device to enter into a power-down mode. In case of a memory chip, it is further desirable to be able to selectively turn on/off various memory input buffers to conserve current consumption, especially active and precharge standby currents.

SUMMARY

The present disclosure contemplates a method of operating an electronic device. The method comprises supplying a chip select signal having an active state and an inactive state; and activating at least one input buffer in the electronic device when the chip select signal is in the active state and deactivating the input buffer when the chip select signal is in the inactive state.

In one embodiment, the present disclosure further contemplates a method of operating an electronic device. The method comprises supplying at least one control signal as part of an initiation of a data access operation within the electronic device; and supplying a chip select signal as part of the initiation of the data access operation, wherein the chip select signal is supplied at least one clock cycle before the control signal is supplied.

In another embodiment, the present disclosure contemplates a method of operating a memory device. The method comprises supplying a set of control signals to the memory device as part of an initiation of a data access operation; delaying one of the control signals by at least one clock cycle within the memory device, thereby generating an at least one clock cycle-delayed version of one of the control signals; and supplying the at least one clock cycle-delayed version of one of the control signals to a data access control unit in the memory device along with the remainder of control signals from the set of control signals.

The present disclosure also contemplates a method of operating a memory device. The method comprises supplying a chip select signal to the memory device, wherein the chip select signal has an active state and an inactive state; and supplying at least one control signal to the memory device as part of an initiation of a data access operation, wherein the control signal is supplied to the memory device at least one clock cycle after the chip select signal.

In a further embodiment, the present disclosure contemplates a memory device. The method device comprises a plurality of memory cells to store data; and an I/O circuit configured to facilitate a data read/write operation from/to one or more of the plurality of memory cells. The I/O circuit includes an input circuit configured to receive a chip select signal and generate a latched version of the chip select signal; and a plurality of memory input buffers coupled to the input circuit. Each memory input buffer receives a corresponding control signal to facilitate the data read/write operation, wherein the latched version of the chip select signal is supplied to a power terminal of each of the plurality of memory input buffers so as to activate/deactivate each of the plurality of memory input buffers using the latched version of the chip select signal.

A system according to one embodiment of the present disclosure contemplates a memory device to store data therein and to retrieve data therefrom; a bus; and a memory controller coupled to the memory device via the bus to facilitate data transfer to/from the memory device over the bus. The memory controller is configured to generate a chip select signal and a plurality of control signals to facilitate the data transfer, and the memory controller is configured to supply the chip select signal to the memory device at least one clock cycle before supplying the plurality of control signals to the memory device during the data transfer.

According to a system and method of the present disclosure, the standby currents in input buffers in an electronic device (e.g., a memory device) are reduced when the input buffers may be activated or deactivated by the state of a chip select (CS) signal. In case of a memory device, the active and precharge standby currents in memory input buffers may be reduced by turning off the input buffers when the CS signal is in an inactive state. A memory controller may supply the CS signal to the memory device at least one clock cycle earlier than other control signals including the RAS (row address strobe) signal, the CAS (column address strobe) signal, the WE (write enable) signal, etc. A modified I/O circuit in the memory device may internally delay the CS signal by at least one clock cycle to coincide its timing with the RAS/CAS signals for normal data access operation whereas the turning on/off of the memory input buffers may be performed by the CS signal received from the memory controller on the previous cycle. Thus, activation and deactivation of memory input buffers may be performed without forcing the memory device into power down mode and without employing complex circuits for power management.

BRIEF DESCRIPTION OF THE DRAWINGS

For the present disclosure to be easily understood and readily practiced, the present disclosure will now be described for purposes of illustration and not limitation, in connection with the following figures, wherein:

FIGS. 2A–2D depict simplified diagrams illustrating an exemplary prior art timing relationship among the chip select (CS), column address strobe (CAS), and row address strobe (RAS) signals during a memory read operation;

FIGS. 3A–3D show a simplified diagram illustrating an exemplary timing relationship among the CS, CAS, and RAS signals during a memory read operation according to one embodiment of the present disclosure;

FIG. 4 depicts an exemplary circuit configuration for a portion of an I/O circuit configured to implement the timing relationship illustrated by way of an example in FIGS. 3A–3D;

DETAILED DESCRIPTION

Figure 1:
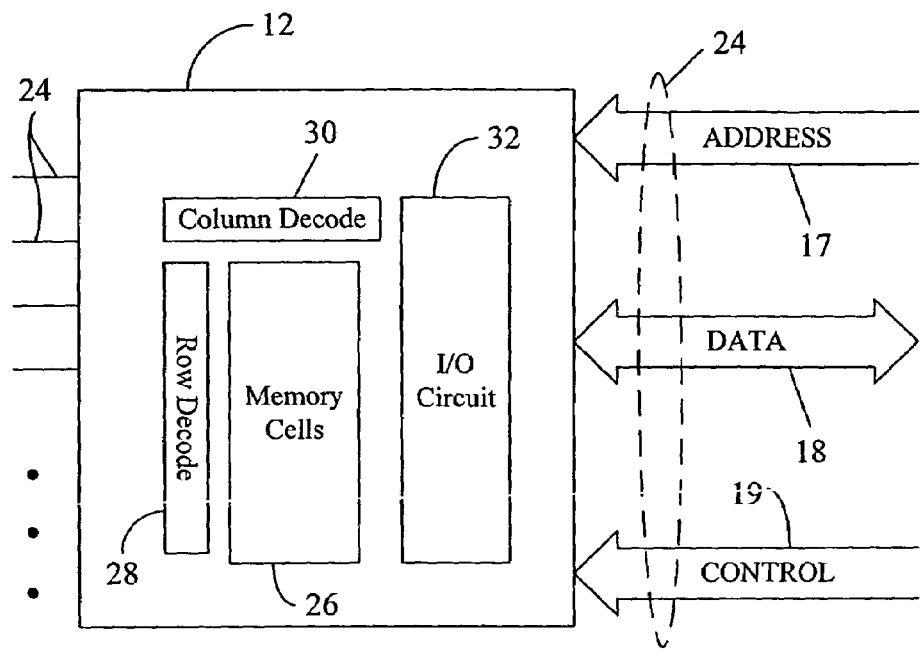
FIG. 1 is a simplified block diagram showing a memory chip or memory device.

Reference will now be made in detail to certain embodiments of the present disclosure, examples of which are illustrated in the accompanying drawings. It is to be understood that the figures and descriptions of the present disclosure included herein illustrate and describe elements that are of particular relevance to the present disclosure, while eliminating, for the sake of clarity, other elements found in typical solid-state electronic devices, memories or memory-based systems. It is noted at the outset that the terms "connected", "connecting," "electrically connected," etc., are used interchangeably herein to generally refer to the condition of being electrically connected. It is further noted that various block diagrams and circuit diagrams shown and discussed herein employ logic circuits that implement positive logic, i.e., a high value on a signal is treated as a logic "1" whereas a low value is treated as a logic "0." However, any of the circuits discussed herein may be easily implemented in negative logic (i.e., a high value on a signal is treated as a logic "0" whereas a low value is treated as a logic "1").

FIGS. 3A–3D (collectively referred to herein as "FIG. 3") show a simplified diagram illustrating an exemplary timing relationship among the chip select (CS), column address strobe (CAS), and row address strobe (RAS) signals during a memory read operation according to one embodiment of the present disclosure. It is seen from FIG. 3 that the CS signal is supplied at time t=t1, which is at least one clock cycle before the initiation of the reading operation at time t=t2. In other words, according to one embodiment of the present disclosure, the CS signal is asserted at least one clock cycle before the CAS and RAS signals (and other relevant address and control signals (e.g., the WE signal)) change state. As discussed later hereinbelow, the addition of at least one clock cycle of latency to the CS signal may significantly reduce active and precharge standby currents in the memory input buffers.

FIG. 4 depicts an exemplary circuit configuration 38 for a portion of an I/O circuit (e.g., the I/O circuit 82 in FIG. 7) configured to implement the timing relationship illustrated by way of an example in FIGS. 3A–3D. An address input buffer 40 receives the address signals (carrying address information of the memory address to be accessed for a data read/write operation) ADD<0 . . . n>41 and sends out the buffered addressed signals to an address latch 54. A CAS input buffer 42 receives a CAS signal 43 and sends it out to a CAS latch 56, and a RAS input buffer 44 receives a RAS signal 45 as input and sends it to a RAS latch 58. Each of the three memory input buffers 40, 42, 44 is turned on/off using a signal CS_M0* 47 supplied to their power-up input buffer (PUIB) terminals as shown in FIG. 4 and described later hereinbelow. A clock buffer 48 receives a clock signal 50 and supplies its buffered version CLK 52 to various clock inputs in the latches 54, 56, 58, and to a group of series connected CS delay latches 66, 68, 70, and 72 as shown. As noted hereinbefore, for the sake of simplicity, all clock signals in the circuit 38 are referred to by the reference letters "CLK" regardless of any distinctions such as, for example, an input clock or an output clock or a buffered clock, etc. Thus, even though there may be slight phase differences among various clocks in the circuit 38, such phase differences are ignored for the present discussion and all clocks are treated without any distinction. Furthermore, it is observed that the clock input CLK 50 to the CLK buffer 48 may be supplied directly from an external memory controller (not shown) or a system clock (not shown), or indirectly through one or more additional clock buffers (not shown) or DLL (delay locked loop) circuit(s) (not shown).

The outputs of the latches 54, 56, 58 are clocked by the CLK signal 52 and are denoted as the ADD_Out signals 61, the CAS_Out signal 60, and the RAS_Out signal 62, respectively. These outputs are supplied to a control logic 74 which operates on the outputs and, based on the timing relationship between these outputs, determines whether a data read or write operation is desired in the current clock cycle, whether to activate a row or to precharge the row, etc. Additional signals (not shown) may be supplied to the control logic 74 to enable it to determine the type of operation to be performed during the current clock cycle. Because the operation and constructional details of the control logic 74 are known in the art, additional circuit details and discussion for the control logic 74 are not provided herein for the sake of brevity.

It is seen from FIG. 4 that a chip select (CS) signal 64 is not directly supplied to the control logic 74. Instead, the CS signal 74 is applied to the chain of clocked delay latches 66, 68, 70, and 72. Each of the delay latches, except the first latch 66, introduces a corresponding delay into the CS signal 64. For example, the first latch (i.e., the CS_M0 latch 66) receives the CS signal 64 at its input and generates a CS_M0 signal 67 at its output without introducing any delay into the CS signal 64. In other words, the CS_M0 signal 67 is a zero clock cycle-delayed latched version of the CS signal 64. On the other hand, the CS_M1 delay latch 68 generates the CS_M1 69 output signal which is a one clock cycle-delayed latched version of the CS signal 64. In the embodiment of FIG. 4, the CS_M1 signal 69 is supplied as an input to the control logic 74. The timing relationship of the CS_M1 signal 69 in conjunction with the CAS_Out signal 60 and the RAS_Out signal 62 is discussed later hereinbelow with reference to FIGS. 5A–5I.

It is noted here that the CS_M2 latch 70 provides a two clock cycle delay and the CS_M3 latch 72 provides a three clock cycle delay to the CS signal 64. The outputs of these latches 70 and 72 are not shown in FIG. 4 for the sake of simplicity. However, in other embodiments, the output of one of the latches 70 or 72 may be used as an input to the control logic 74 if desired.

As shown in FIG. 4, the CS_M0 signal 67 is supplied as an input to a delay element 46, which generates a delayed version of the CS_M0 signal 67. The delayed version is denoted as the CS_M0*signal 47, which is supplied to PUIB input terminals of the memory input buffers 40, 42, and 44 as noted before. It is noted here that although only three input buffers 40, 42, and 44 are shown in FIG. 4 for the sake of simplicity and ease of illustration, it is known to one skilled in the art that there may be many more such input buffers in a memory chip. In that case, all or a portion of these input buffers may be provided with the CS_M0* signal 47 to perform selective activation/deactivation of the buffers to conserve electrical currents during row active and precharge standby periods as discussed below. Further, it is noted that the term "memory input buffer", as used herein, also includes various other control signal input buffers (similar to the RAS input buffer 45, the CAS input buffer 43, etc.) that receive the corresponding control signals (e.g., a write enable (WE) signal) during a memory data access operation.

FIGS. 5A–5I (collectively referred to herein as "FIG. 5") show an exemplary set of waveforms generated in the circuit configuration of FIG. 4 along with the timing relationship among different signals during a memory read operation. In FIG. 5, all timing relationships are represented relative to the CLK signal 52. Although the waveforms in FIG. 5 are not drawn to scale or may not be an accurate representation of shapes, durations, strengths, etc., of those signals in FIG. 5 that may be present during a data read operation in an actual memory chip, it is noted that the waveforms in FIG. 5 are drawn to sufficiently accurately convey the one clock cycle CS latency aspect of the timing relationship illustrated in FIG. 3. Thus, it is seen from FIG. 5 that the CS signal 64 is supplied to the circuit 38 at least one clock cycle (of clock signal CLK 52) prior to the RAS and CAS signals 45 and 43, respectively, are supplied to the circuit 38. Furthermore, although not shown in FIG. 5, it is noted that various other address and control signals (e.g., the WE signal) are also appropriately delayed (in a manner similar to the delayed RAS, CAS signals 45, 43, respectively) with respect to the CS signal. The outputs CS_M0 67 and CS_M0* 47 are shown generated shortly after (i.e., after some inherent delay at the latch 66 and a minor (in picoseconds) delay by the delay element 46) the CS signal 64 is applied to the CS_M0 latch 66 as shown in FIG. 5. The delay provided by the delay element 46 may be suitably adjusted so as to apply the CS_M0* signal in the active state (active "low" state in FIG. 5) to the input buffers when the RAS, CAS and other control signals (not shown) are asserted, thereby allowing latching of proper states of these control signals.

Figure 5:
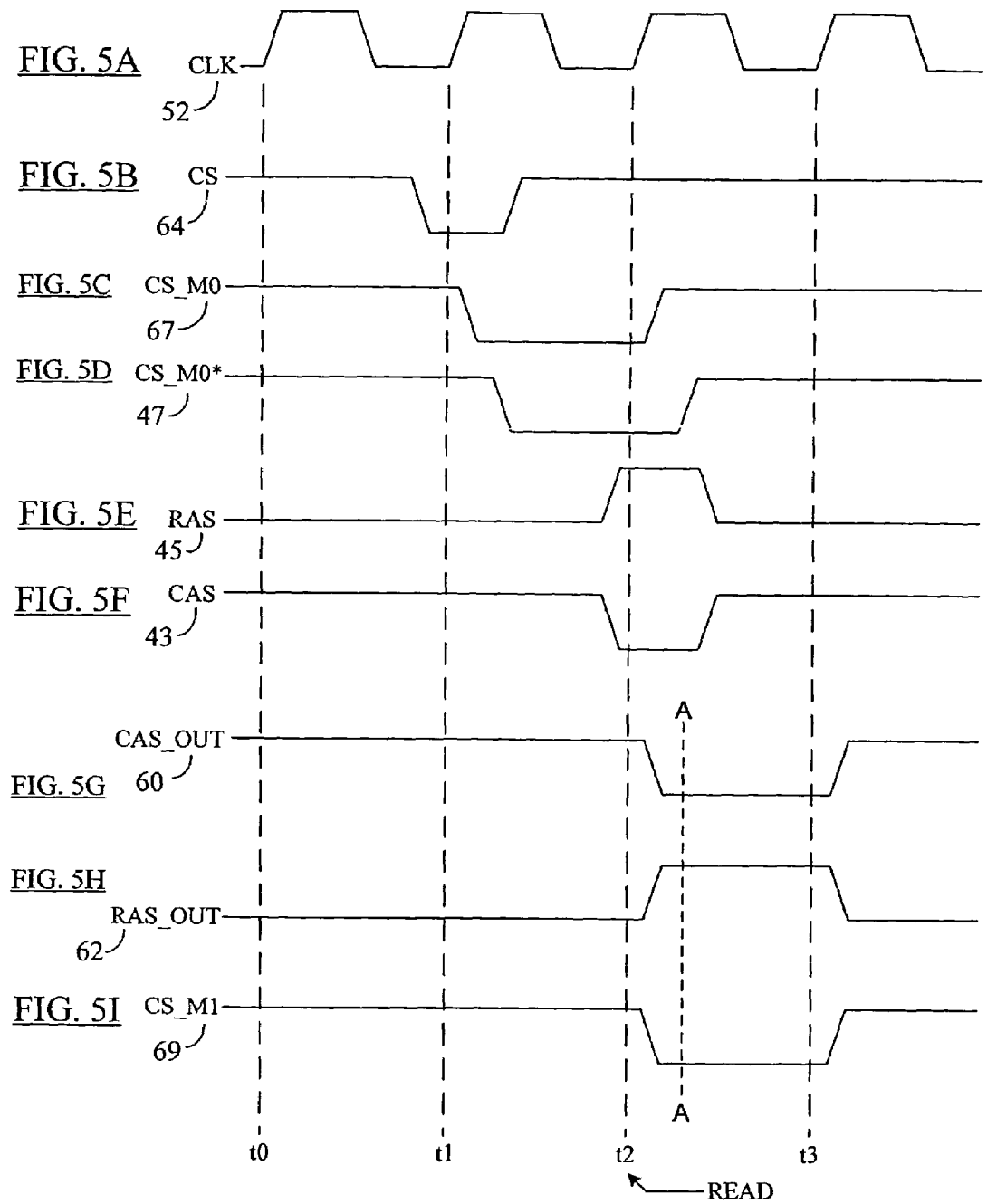
FIGS. 5A–5I show an exemplary set of waveforms generated in the circuit configuration of FIG. 4 along with the timing relationship among different signals during a memory read operation.
Figure 6:
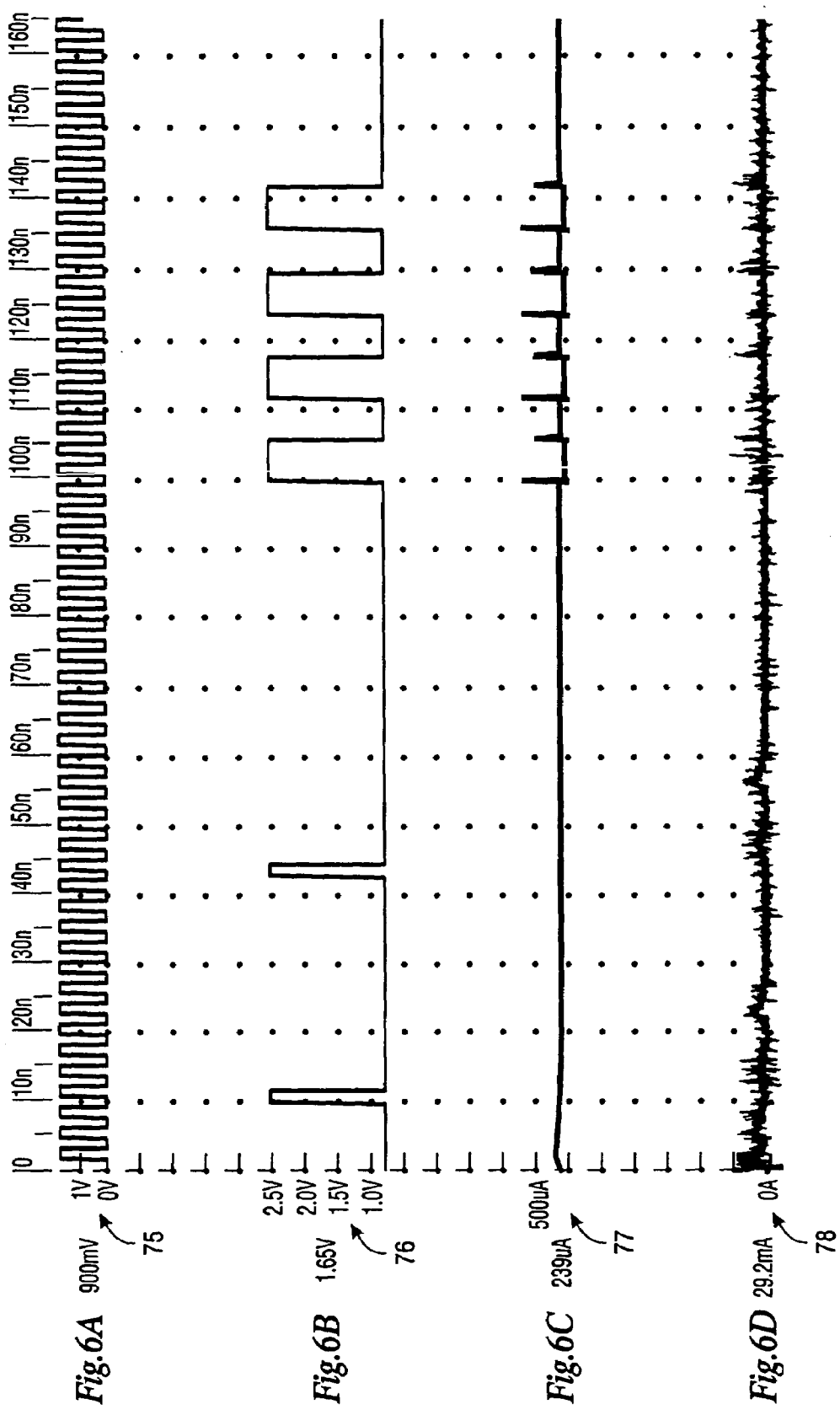
FIGS. 6A–6D show an exemplary set of simulated waveforms illustrating the standby current consumption by a memory input buffer in relation to the total standby current.

In the embodiment of FIG. 4, the CS_M0* signal 47 is derived from the CS signal 64 to perform selective activation/deactivation of the memory input buffers 40, 42, 44 as noted before. The CS_M0* signal 47 is used to turn on the input buffers 40, 42, 44 when the signal 47 is active (i.e., when it is in the "low" state). Once the CS_M0* signal 47 becomes inactive (goes "high"), the input buffers 40, 42, 44 are turned off because of the control of the turning on/off of the input buffers 40, 42, 44 by the application of the CS_M0* signal 47 to the PUIB inputs of the buffers as shown in FIG. 4. Because the CS_M0* signal 47 is derived from the CS signal 64, it is evident that, in the embodiment of FIG. 4, the activation and deactivation of the memory input buffers 40, 42, 44 is performed using, respectively, the "low" and "high" states of the CS signal 64. As shown in FIG. 5, the RAS and CAS signals 45, 43, respectively, appear a clock cycle after the CS signal 64. Although not illustrated in FIG. 5, it is noted that other address and control signals (e.g., the WE signal) are also similarly delayed one clock cycle from the assertion of the CS signal 64 so as to accomplish the memory access operation according to one embodiment of the present disclosure. The polarities of the CS and RAS/CAS signals in FIG. 5 are consistent with those shown in FIGS. 2 and 3 to represent a memory read operation. Once the CS_M0* signal 47 turns on the input buffers 42 and 44, their respective latches 56 and 58 sample the CAS/RAS signals and generate the CAS_Out and the RAS_Out signals 60, 62 at their outputs, respectively. Thus, the CS_M0* signal 47 may return to the "high" state after this sampling, thereby turning the input buffers 42 and 44 off. The timing relationship between the CS_M0* signal 47 and the RAS/CAS signals may be such that the deactivation of the input buffers 42 and 44 through the high state of the CS_M0* signal 47 may not prevent the latching of the RAS/CAS signals. This timing relationship is shown in FIG. 5 by the vertical, dotted line at t=t2.

It is noted that the ADD_Out signals 61 are not shown in FIG. 5 because of their lack of relevance to the present discussion. It is understood, however, by one skilled in the art that the ADD_Out signals 61 are also latched in the similar manner by the latch 54 (and other memory control signals (not shown) are latched by their respective latches (also not shown)) and acted on by the control logic 74 along with the RAS_Out, CAS_Out and other memory access timing signals to determine and initiate the desired data transfer (read or write) operation.

As noted before, the RAS_Out signal 62 and the CAS_Out signal 60 are supplied to the control logic 74. However, instead of receiving the CS signal 64, the control logic in the embodiment of FIG. 4 receives the CS_M1 signal 69 at time t=t2 (i.e., when a data read operation is initiated). In other words, the control logic receives the RAS_Out signal 62 (representing the RAS signal 45), the CAS_Out signal 60 (representing the CAS signal 43) and the CS_M1 signal 69 (representing the CS signal 64) relatively simultaneously. This timing relationship is similar to the prior art data read timing illustrated in FIG. 2, thereby allowing the control logic 74 to act on these (and other) inputs to determine the type of data access operation (here, a data read operation) and also to generate additional control signals for the other memory circuits (e.g., row and column address decoders (not shown), etc.). The preservation of the prior art timing relationship of FIG. 2 among the CS_M1, CAS_Out and RAS_Out signals in FIG. 4 (as illustrated by the vertical dotted line A—A in FIG. 5) allows for implementation of the current reduction methodology of the present disclosure using existing memory input buffers and control logic. An existing memory I/O circuit (not shown) may be modified in the form of addition of circuits to process the CS signal 64 to obtain the CS_M0* signal 47 and other delayed versions of the CS signal without significant alterations.

Thus, according to one embodiment of the present disclosure, the CS signal (e.g., the CS signal 64) may be used (e.g., in the form of the CS_M0* signal 47) to activate various memory input buffers (e.g., the buffers 40, 42, and 44 in FIG. 4) just prior to initiation of a data access operation to an addressed memory location. The "inactive" state of the CS signal may then be used to deactivate or turn off the memory input buffers so as to reduce active and precharge standby current consumption in the memory input buffers in the absence of a pending data access operation. As discussed above, such current preservation may be accomplished by adding one clock cycle of latency to the CS signal so that the input buffers can be activated or deactivated by the state of the CS signal on the clock cycle that is previous to the clock cycle when a data access operation is initiated. To accomplish such CS latency, it may be preferable to supply the CS signal one clock cycle earlier than all other control signals related to data access (e.g., the RAS signal, the CAS signal, etc.) as is illustrated in FIGS. 3 and 5. In a memory I/O circuit (e.g., the circuit portion 38 in FIG. 4), the CS signal may be internally delayed one clock cycle, thereby generating its one clock cycle delayed version (e.g., the CS_M1 signal 69 in FIGS. 4–5) that may be used for normal data access function whereas the original CS signal (here, its derivative version, i.e., the CS_M0* signal 47) occurring at the previous clock cycle may be used to control the power consumption in a memory chip's input buffers.

It is observed that more CS latency (for example, up to three clock cycles) may be possible with a quick locking DLL (delay locked loop) circuit (not shown) in a memory chip. The embodiment in FIG. 4 illustrates the availability of such three clock cycle CS latency when the output (not shown) of the CS_M3 delay latch 72 is supplied to the control logic instead of the one clock cycle-delayed version (the CS_M1 signal 69). The output of the CS_M2 latch 70 may provide two clock cycle of latency as is evident from the circuit configuration in FIG. 4. Such extended delays may be obtained so long as other relevant signals (e.g., the RAS_Out signal 62, the CAS_Out signal 60, etc.) are also similarly delayed so that their "active" signal portions coincide with the "active" portion of the delayed CS signal as is the case with a one clock cycle delayed version of the CS signal 64 illustrated in FIG. 5. Furthermore, such CS-based activation/deactivation methodology may be used to turn on/off one or more DLL's (not shown) in a memory chip to further save current consumption. However, it may be preferable to have a quick-locking DLL in such a situation so as not to over-delay the generation of the DLL output signal (e.g., a memory clock signal (not shown)) when the DLL is turned on after being in an inactive state. Other circuit elements or buffers may be similarly turned on/off based on the state of the CS signal.

In one embodiment, an extended mode register (EMR) (not shown) bit in a memory chip (e.g., a DDR SDRAM chip) may be programmed (using, for example, an external memory controller (not shown)) to enable such CS latency option for the memory chip along with the number of clock cycles of latency desired. The memory controller, on the other hand, may be programmed to supply the CS signal one clock cycle earlier than other control signals for data access (e.g., the RAS signal, the CAS signal, etc.). The circuit 38 in FIG. 4 may be configured with appropriate logic elements so that the programmed EMR bit may be used to activate or turn on the logic circuits associated with the generation of various delayed versions of the CS signal (e.g., the CS_M0* signal 47, the CS_M1 signal 69, etc.).

It is noted that in one embodiment the CS_M1 signal 69 may be supplied to the control logic 74 (in FIG. 4) via a switch (not shown). The activation/deactivation of the switch may be linked to the states of various control signals including the RAS signal 45, the CAS signal 43, the WE (write enable) (not shown) the signal, etc. For example, when the "off" states of the RAS/CAS/WE signals are NOP (No Operation) states, the switch may be deactivated or turned off to prevent the CS_M1 signal 69 from reaching the control logic 74. Similarly, if the CS signal 64 is in inactive or "off" state (i.e., the logic "1" state in the embodiment of FIG. 5B), the switch may be turned off so as not to supply any CS_M1 signal 69 to the control logic 74. A memory system designer may take into account such additional design considerations for the outputs of the CS_M2 delay latch 70 or the CS_M3 delay latch 72 as well in the event that the output of one of these latches is supplied to the control logic 74 instead of the CS_M1 signal 69 as noted hereinbefore.

FIGS. 6A–6D (collectively referred to hereinafter as "FIG. 6") show an exemplary set of simulated waveforms illustrating the standby current consumption by a memory input buffer in relation to the total standby current. In the embodiment of FIG. 6, the waveform 75 represents a clock signal and the waveform 76 represents waveforms (i.e., address line signals) generated by address pad toggling. The address line waveforms 76 are simulated as inputs to an address input buffer (similar to the buffer 40 in FIG. 4) (not shown). The waveform 77 shows a simulation of the current consumption by the address input buffer (not shown) during normal IDD3N (i.e., active standby current when CS is "high") conditions. It is seen from the value (i.e., 239 µA) adjacent to the waveform 77 that the input buffer may pull an average of 239 µA of current during such normal IDD3N condition. The average standby current consumption (here, 239 µA) may be obtained from the current values measured for each time interval denoted by vertical dotted lines in FIG. 6. It is seen from FIG. 6 that the average current consumption is shown for just one memory input buffer (here, a memory address input buffer). Thus, in the event that there are 20 (twenty) memory input buffers (e.g., the RAS input buffer, the CAS input buffer, the WE input buffer, etc.), the total active standby current consumption attributable to the input buffers would equal to 4.78 mA (239 µA×20). The last waveform 78 in FIG. 6 shows an average value of the total IDD3N current in a memory chip (not shown), which, in this embodiment, is equal to 29.2 mA. Thus, the input buffer current consumption is approximately 16% of the total IDD3N current of 29.2 mA. With the use of the CS-based input buffer activation/deactivation discussed hereinbefore, the total input buffer active standby current may be reduced to almost 0 mA (by turning off the input buffers using the "inactive" or "high" state of CS signal during IDD3N conditions) and, hence, the total IDD3N may be reduced by 4.78 mA from 29.2 mA to 24.42 mA (29.2 mA−4.78 mA=24.42 mA). Although not shown in FIG. 6, it is observed that a similar current consumption may take place during the precharge standby period as discussed hereinbefore. Thus, a similar reduction in current consumption may also be achieved during the precharge standby period. On low power electronic parts (e.g., a cell phone or a battery operated consumer electronic gadget operating on power of $\leq 1.5V$) without a DLL, the percentage of reduction in current consumption may be higher when the CS-based activation/deactivation of various input buffers is present.

Figure 7:
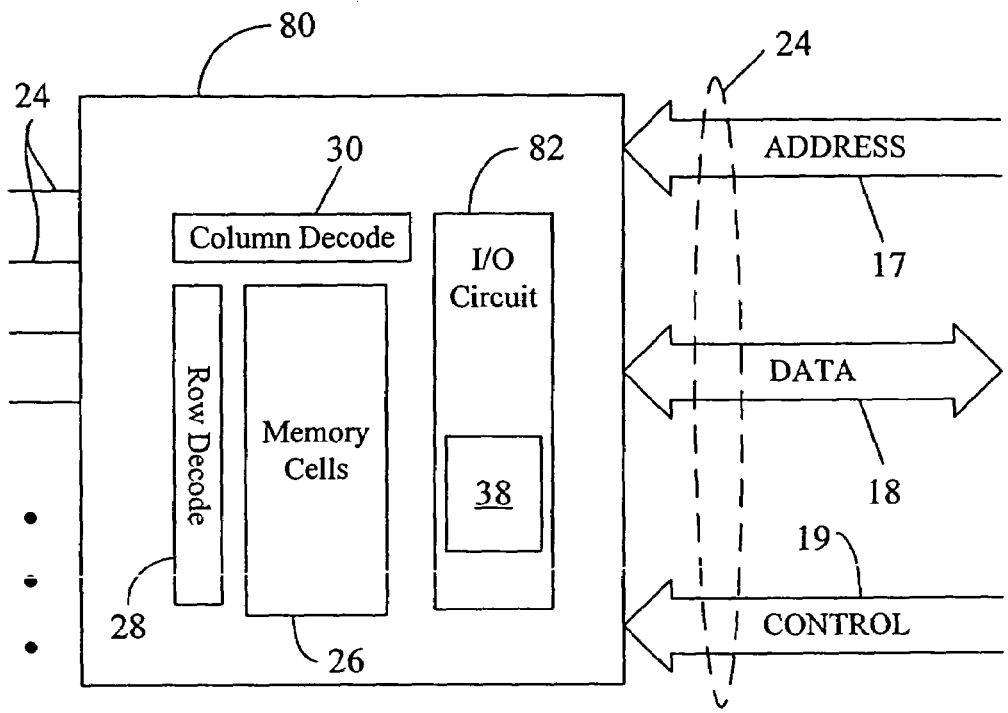
FIG. 7 is a simplified block diagram showing a memory chip that employs the circuit configuration of FIG. 4 as part of an I/O circuit in the memory chip.

FIG. 7 is a simplified block diagram showing a memory chip 80 that employs the circuit configuration 38 of FIG. 4 as part of an I/O circuit 82 in the memory chip 80. Thus, the I/O circuit 82 in FIG. 7 is illustrated to include the circuit 38. The memory chip 80 can be a dynamic random access memory (DRAM) or another type of memory circuits such as SRAM (Static Random Access Memory) or Flash memories. Furthermore, the DRAM could be a synchronous DRAM commonly referred to as SGRAM (Synchronous Graphics Random Access Memory), SDRAM (Synchronous Dynamic Random Access Memory), SDRAM II, or DDR SDRAM (Double Data Rate SDRAM), as well as Synchlink or Rambus DRAMs. In one embodiment, the memory chip 80 is a DDR DRAM operating at a clock frequency of 333 MHz and an I/O data rate of 667 MHz. It is noted here that although other elements in the memory chip 80 are designated with the same reference numerals as those given in FIG. 1, it may be possible that those components having same reference numerals may not be identical in the memories 12 and 80. For example, the row and column decode logic 28, 30, respectively, in the memory chip 80 may be different from the similar elements shown in chip 12 to take into account a CS-based memory input buffer activation/deactivation through the circuit 38 in the I/O unit 82. However, for the sake of simplicity, units with similar functionality are denoted by same reference numerals in FIGS. 1 and 7.

Figure 8:
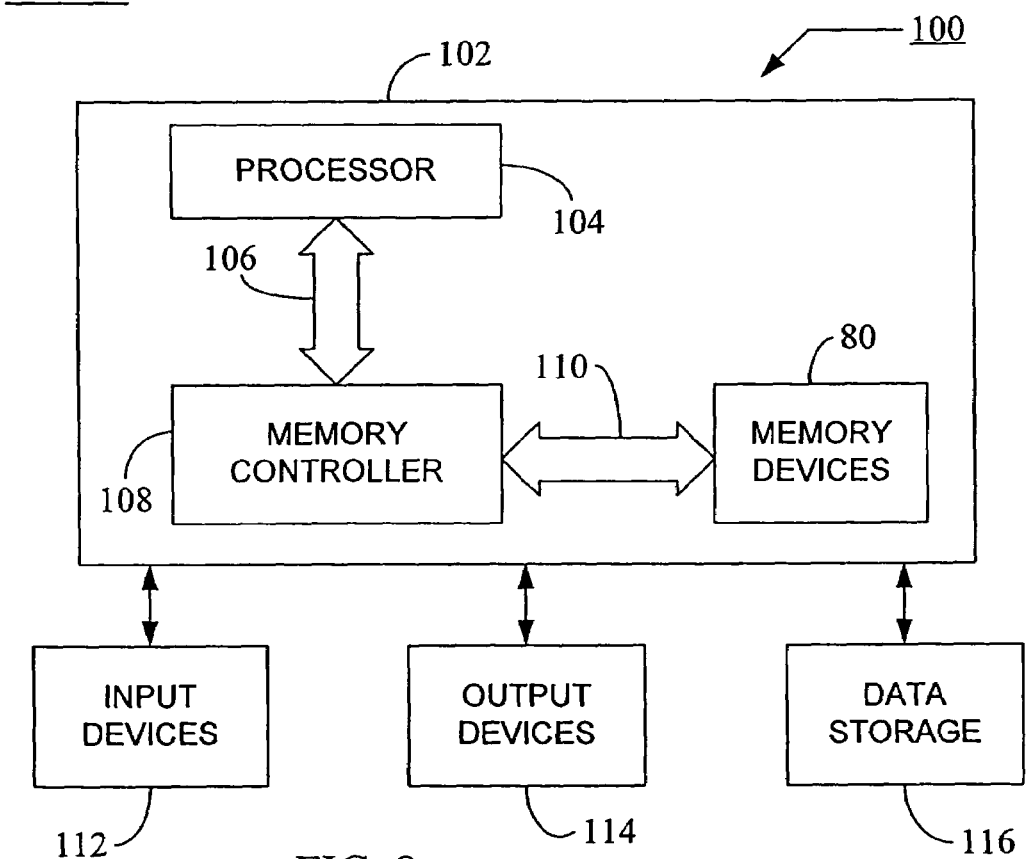
FIG. 8 is a block diagram depicting a system in which one or more memory chips illustrated in FIG. 7 may be used.

FIG. 8 is a block diagram depicting a system 100 in which one or more memory chips 80 illustrated in FIG. 7 may be used. The system 100 may include a data processing unit or computing unit 102 that includes a processor 104 for performing various computing functions, such as executing specific software to perform specific calculations or data processing tasks. The computing unit 102 also includes a memory controller 108 that is in communication with the processor 104 through a bus 106. The bus 106 may include an address bus (not shown), a data bus (not shown), and a control bus (not shown). The memory controller 108 is also in communication with a set of memory devices 80 (i.e., multiple memory chips 80 of the type shown in FIG. 7) through another bus 110 (which may be similar to the bus 24 shown in FIG. 7). Each memory device 80 may include appropriate data storage and retrieval circuitry (not shown in FIG. 8) as shown in FIG. 7. The processor 104 can perform a plurality of functions based on information and data stored in the memories 80.

The memory controller 108 can be a microprocessor, digital signal processor, embedded processor, micro-controller, dedicated memory test chip, a tester platform, or the like. The memory controller 108 may control routine data transfer operations to/from the memories 80, for example, when the memory devices 80 are part of an operational computing system 102. The memory controller 108 may reside on the same motherboard (not shown) as that carrying the memory chips 80. Various other configurations of electrical connection between the memory chips 80 and the memory controller 108 may be possible. For example, the memory controller 108 may be a remote entity communicating with the memory chips 80 via a data transfer or communications network (e.g., a LAN (local area network) of computing devices).

The system 100 may include one or more input devices 112 (e.g., a keyboard or a mouse) connected to the computing unit 102 to allow a user to manually input data, instructions, etc., to operate the computing unit 102. One or more output devices 114 connected to the computing unit 102 may also be provided as part of the system 100 to display or otherwise output data generated by the processor 104. Examples of output devices 114 include printers, video terminals or video display units (VDUs). In one embodiment, the system 100 also includes one or more data storage devices 116 connected to the data processing unit 102 to allow the processor 104 to store data in or retrieve data from internal or external storage media (not shown). Examples of typical data storage devices 116 include drives that accept hard and floppy disks, CD-ROMs (compact disk read-only memories), and tape cassettes. As noted before, the memory devices 80 in the computing unit 102 have the configuration illustrated in FIG. 7, i.e., each memory device 80 includes an I/O circuit 82.

It is observed that although the discussion given hereinbefore has been primarily with reference to memory devices, it is evident that the standby current reduction methodology discussed hereinbefore with reference to FIGS. 3–5 may be employed, with suitable modifications which may be evident to one skilled in the art, in any non-memory electronic device that may utilize a chip select (CS) signal (or a signal having similar functionality) during a data access or data transfer operation or during any other operation that may be dependent on an active state of such CS signal as illustrated, for example, in FIGS. 3 and 5 herein with reference to a memory read operation. Power activation of various buffers (or similar circuit components) in such an electronic device may be suitably controlled using the CS-based circuit activation/deactivation methodology discussed hereinabove or a methodology similar in principle as may be evident to one skilled in the art.

The foregoing describes a system and method to reduce standby currents in input buffers in an electronic device (e.g., a memory device). The input buffers may be activated or deactivated by the state of a chip select (CS) signal. In case of a memory device, the active and precharge standby currents in memory input buffers may be reduced by turning off the input buffers when the CS signal is in an inactive state. A memory controller may supply the CS signal to the memory device at least one clock cycle earlier than other control signals including the RAS (row address strobe) signal, the CAS (column address strobe) signal, the WE (write enable) signal, etc. A modified I/O circuit in the memory device may internally delay the CS signal by at least one clock cycle to coincide its timing with the RAS/CAS signals for normal data access operation whereas the turning on/off of the memory input buffers may be performed by the CS signal received from the memory controller on the previous cycle. Thus, activation and deactivation of memory input buffers may be performed without forcing the memory device into power down mode and without employing complex circuits for power management.

While the disclosure has been described in detail and with reference to specific embodiments thereof, it will be apparent to one skilled in the art that various changes and modifications can be made therein without departing from the spirit and scope of the embodiments. Thus, it is intended that the present disclosure cover the modifications and variations of this disclosure provided they come within the scope of the appended claims and their equivalents.

What is claimed is:

1. In a method of operating a solid state memory device of the type requiring a chip select (CS) signal and one of a row address strobe (RAS) and a column address strobe (CAS) control signal as part of an initiation of a memory access operation, the improvement comprising delaying the application of said CS signal within said memory device at least one clock cycle before said control signal.

2. In the method of claim 1, the improvement further comprising activating and deactivating at least one control signal input buffer in said memory device based on activation and deactivation of said CS signal, respectively.

3. A method of operating a memory device, comprising:
   supplying a set of control signals to said memory device as part of an initiation of a memory access operation;
   delaying one of said control signals by at least one clock cycle within said memory device, thereby generating an at least one clock cycle-delayed version of said one of said control signals; and
   supplying said at least one clock cycle-delayed version of said one of said control signals to a data access control unit in said memory device along with the remainder of control signals from said set of control signals.

4. The method of claim 3, further comprising:
   activating at least one control signal input buffer when said one of said control signals is in an active state; and deactivating said at least one control signal input buffer when said one of said control signals is in an inactive state.

5. A method of operating a memory device, comprising: supplying a chip select signal to said memory device, wherein said chip select signal has an active state and an inactive state; supplying at least one of a row address strobe (RAS) and a column address strobe (CAS) control signal to said memory device as part of an initiation of a memory access operation, wherein said at least one control signal is supplied to said memory device at least one clock cycle after said chip select signal; and activating at least one input buffer in said memory device when said chip select signal is in said active state and deactivating said at least one input buffer when said chip select signal is in said inactive state.

6. The method of claim 5, wherein said at least one input buffer includes one of a column address strobe (CAS) input buffer; a row address strobe (RAS) input buffer; or a memory address input buffer.

7. A memory device, comprising:
a plurality of memory cells to store data; and
an I/O circuit configured to facilitate a data read/write operation from/to one or more of said plurality of memory cells, wherein said I/O circuit includes:
an input circuit configured to receive a chip select signal and generate a latched version of said chip select signal; and
a plurality of memory input buffers coupled to said input circuit, wherein each memory input buffer receives a corresponding control signal to facilitate said data read/write operation, wherein said latched version of said chip select signal is supplied to a power terminal of each of said plurality of memory input buffers so as to activate/deactivate each of said plurality of memory input buffers using said latched version of said chip select signal.

8. The memory device of claim 7, wherein said I/O circuit further comprises:
a control logic coupled to said input circuit and said plurality of memory input buffers to facilitate said data read/write operation; and
a plurality of latches coupled to said plurality of memory input buffers and said control logic, wherein each of said plurality of latches is coupled to a corresponding one of said plurality of memory input buffers to receive a respective control signal therefrom and to supply a latched version of said respective control signal as an input to said control logic, wherein said input circuit is configured to generate and provide an at least one clock cycle-delayed version of said chip select signal to said control logic.

9. The memory device of claim 8, wherein said input circuit in said I/O circuit includes a plurality of clocked delay latches to generate said at least one clock cycle-delayed version of said chip select signal.

10. The memory device of claim 7, wherein said plurality of memory input buffers in said I/O circuit includes:
a memory address input buffer;
a column address strobe input buffer; and
a row address strobe input buffer.

11. A system, comprising:
a memory device to store data therein and to retrieve data therefrom, said memory device including:
a plurality of memory cells to store data; and
an I/O circuit configured to facilitate data transfer to/from one or more of said plurality of memory cells, wherein said I/O circuit includes:

an input circuit configured to receive a chip select signal and generate a latched version of said chip select signal; and
a plurality of memory input buffers coupled to said input circuit, wherein each memory input buffer receives a corresponding one of a plurality of control signals and wherein said latched version of said chip select signal is supplied to a power terminal of each of said plurality of memory input buffers so as to activate/deactivate each of said plurality of memory input buffers using said latched version of said chip select signal;
a bus; and
a memory controller coupled to said memory device via said bus to facilitate said data transfer to/from said memory device over said bus, wherein said memory controller is configured to generate said chip select signal and said plurality of control signals to facilitate said data transfer, and wherein said memory controller is configured to supply said chip select signal to said memory device at least one clock cycle before supplying said plurality of control signals to said memory device during said data transfer.

12. The system of claim 11, wherein said plurality of control signals includes a row address strobe (RAS) signal and a column address strobe (CAS) signal, and wherein said plurality of memory input buffers in said I/O circuit includes a RAS input buffer configured to receive said RAS signal and a CAS input buffer configured to receive said CAS signal.

13. A memory device, comprising:
a plurality of memory cells to store data; and
an I/O circuit configured to facilitate a data read/write operation from/to one or more of said plurality of memory cells, wherein said I/O circuit includes:
an input circuit configured to receive a chip select (CS) signal and one of a row address strobe (RAS) and a column address strobe (CAS) control signal;
a plurality of memory input buffers coupled to said input circuit, wherein each memory input buffer receives a corresponding control signal to facilitate said data read/write operation;
a circuit for delaying the application of said CS signal within said memory device at least one clock cycle before one of said control signals;
a control logic coupled to said input circuit and said plurality of memory input buffers to facilitate said data read/write operation; and
a plurality of latches coupled to said plurality of memory input buffers and said control logic, wherein each of said plurality of latches is coupled to a corresponding one of said plurality of memory input buffers to receive a respective control signal therefrom and to supply a latched version of said respective control signal as an input to said control logic.

14. The memory device of claim 13, wherein said circuit for delaying includes a plurality of clocked delay latches to generate said at least one clock cycle-delayed version of said chip select signal.

15. The memory device of claim 13, wherein said plurality of memory input buffers in said I/O circuit includes:
a memory address input buffer;
a column address strobe input buffer; and
a row address strobe input buffer.

* * * * *

UNITED STATES PATENT AND TRADEMARK OFFICE
CERTIFICATE OF CORRECTION

| | | |
|---|---|---|
| PATENT NO. | : 7,167,401 B2 | Page 1 of 1 |
| APPLICATION NO. | : 11/055332 | |
| DATED | : January 23, 2007 | |
| INVENTOR(S) | : Eric Stave | |

It is certified that error appears in the above-identified patent and that said Letters Patent is hereby corrected as shown below:

Column 4, Line 10, delete "method" and substitute therefore --memory--.

Column 9, Line 58, delete "the".

Signed and Sealed this

Tenth Day of July, 2007

JON W. DUDAS
*Director of the United States Patent and Trademark Office*